(12) United States Patent
Liu

(10) Patent No.: US 7,701,290 B2
(45) Date of Patent: Apr. 20, 2010

(54) AMPLIFIER GAIN CONTROL CIRCUIT FOR THE WIRELESS TRANSCEIVER

(75) Inventor: Yu-Hua Liu, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 26 days.

(21) Appl. No.: 12/078,688

(22) Filed: Apr. 3, 2008

(65) Prior Publication Data

US 2009/0167574 A1 Jul. 2, 2009

(30) Foreign Application Priority Data

Dec. 27, 2007 (TW) ............................. 96150548 A

(51) Int. Cl.
*H03F 3/45* (2006.01)
(52) U.S. Cl. ........................ 330/254; 330/261
(58) Field of Classification Search .............. 330/254, 330/261, 278; 455/127.2, 232.1, 234.1, 245.1
See application file for complete search history.

(56) References Cited

U.S. PATENT DOCUMENTS 7,148,749 B2 * 12/2006 Rahman et al. ............. 330/279
7,392,027 B2 * 6/2008 Ishihara ................... 455/232.1

* cited by examiner

*Primary Examiner*—Khanh V Nguyen
(74) *Attorney, Agent, or Firm*—Muncy, Geissler, Olds & Lowe, PLLC

(57) ABSTRACT

An amplifier gain control circuit for the wireless transceiver comprises at least one amplifier, an analog to digital converter (ADC), a digital to analog converter (DAC) and a bias circuit, wherein the ADC is used for receiving an analog gain control voltage to generate a digital control signal that can be used for controlling the gain of the amplifier, the DAC is used for receiving the digital signal to generate an analog signal, and the bias circuit is used for receiving the analog signal and the analog gain control voltage to further fine-tune the gain of the amplifier by the analog process for correcting the least bit error during the digital process, therefore, the amplifier during the gain adjustment will be prevented to operate in the nonlinear area.

16 Claims, 7 Drawing Sheets

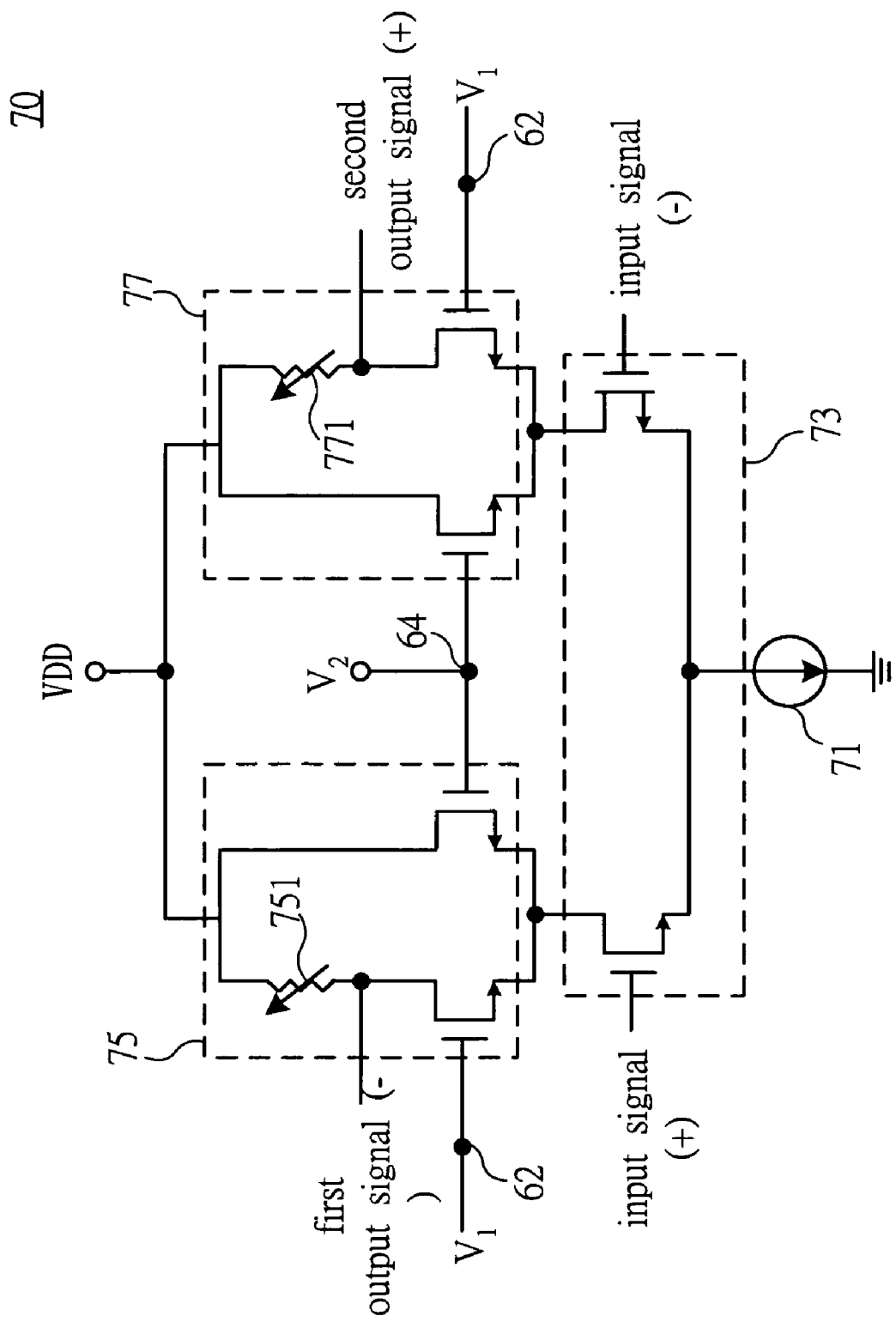

AMPLIFIER GAIN CONTROL CIRCUIT FOR THE WIRELESS TRANSCEIVER

FIELD OF THE INVENTION

The present invention relates in general to an amplifier gain control circuit for the wireless transceiver, adjusting the gain of the amplifier by the digital process and further fine tuning the gain of the amplifier by the association of the analog process for preventing to operate in the nonlinear area during the gain adjustment of the amplifier.

BACKGROUND OF THE INVENTION

Referring to FIG. 1, the amplifier gain control circuit 10 comprises a bias circuit 11 and a plurality of stages amplifiers 13, 14, and 15, wherein the first stage amplifier 13 can be used for receiving an input signal, such as a radio frequency (RF) or an analog signal, therefore, the input signal would be amplified by the first stage amplifier 13, the n-1 stage 14, and the n stage amplifier 15 respectively. The bias circuit 11 is respectively connected to each stage of amplifiers 13, 14, and 15 and used for controlling the gain of each stage of amplifiers 13, 14, and 15. For example, the bias circuit 11 will receive an analog gain control voltage (VAGC) and further generate a plurality of bias signals according to the VAGC, wherein the bias signals will be used for controlling the gain of each stage of amplifiers 13, 14, and 15, accordingly, the input signal will be amplified.

The bias circuit 11 controls the gain of each stage of amplifiers 13, 14, and 15 by the analog process in respect of the prior art. However, while the amplifiers 13, 14, and 15 adjust the gain thereof substantially, the internal elements of the amplifiers 13, 14, and 15, such as transistors, will be operated in the nonlinear area easily, therefore, the amplified gain of the output signal will not reach the requirement of linearity, and that will result to the wireless transceiver cannot work in the optimal state.

SUMMARY OF THE INVENTION

Therefore, an object of the present invention is to provide an amplifier gain control circuit for the wireless transceiver, used for controlling the gain of the amplifier by digital process and further fine tuning the gain of the amplifier by the association of the analog process, such that the least bit error occurred during the digital process can be corrected, and the amplifier during the gain adjustment will prevent to operate in the nonlinear area.

Another object of the present invention is to provide an amplifier gain control circuit for the wireless transceiver, used for controlling the gain of the amplifier by a digital control signal, which is transformed from the analog gain control voltage by an analog to digital converter (ADC).

Another object of the present invention is to provide an amplifier gain control circuit for the wireless transceiver, in which a digital to analog converter (DAC) can be used for transforming the digital control signal into an analog signal, and a bias circuit can be used for correcting refinedly the least bit error according to the analog gain control voltage and the analog signal after the gain of the amplifier has been adjusted by the digital process.

In an aspect of the present invention, a amplifier gain control circuit for the wireless transceiver comprises at least one amplifier; an analog to digital converter connected to the amplifier and used for receiving an analog gain control voltage to transform into a digital control signal, wherein the digital control signal can be used for controlling the gain of the amplifier; a digital to analog converter connected to the analog to digital converter and used for receiving the digital control signal to transform into an analog signal; and a bias circuit connected to the digital to analog converter and the amplifier, used for receiving the analog gain control voltage and the analog signal to control the gain of the amplifier.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

FIG. 7 is a circuit diagram of the analog amplifier unit according to an embodiment of the present invention.

DETAILED DESCRIPTION OF DISCLOSED EMBODIMENTS

Figure 1:
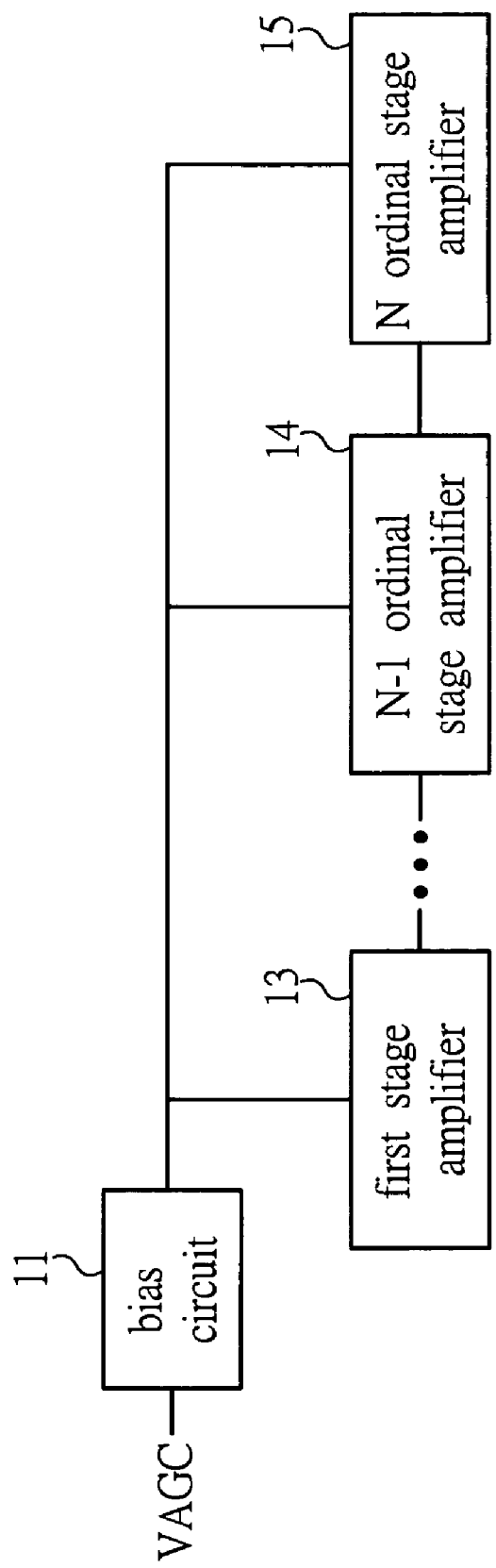
FIG. 1 shows a block diagram of an amplifier gain control circuit for the wireless transceiver according to a prior art.
Figure 2:
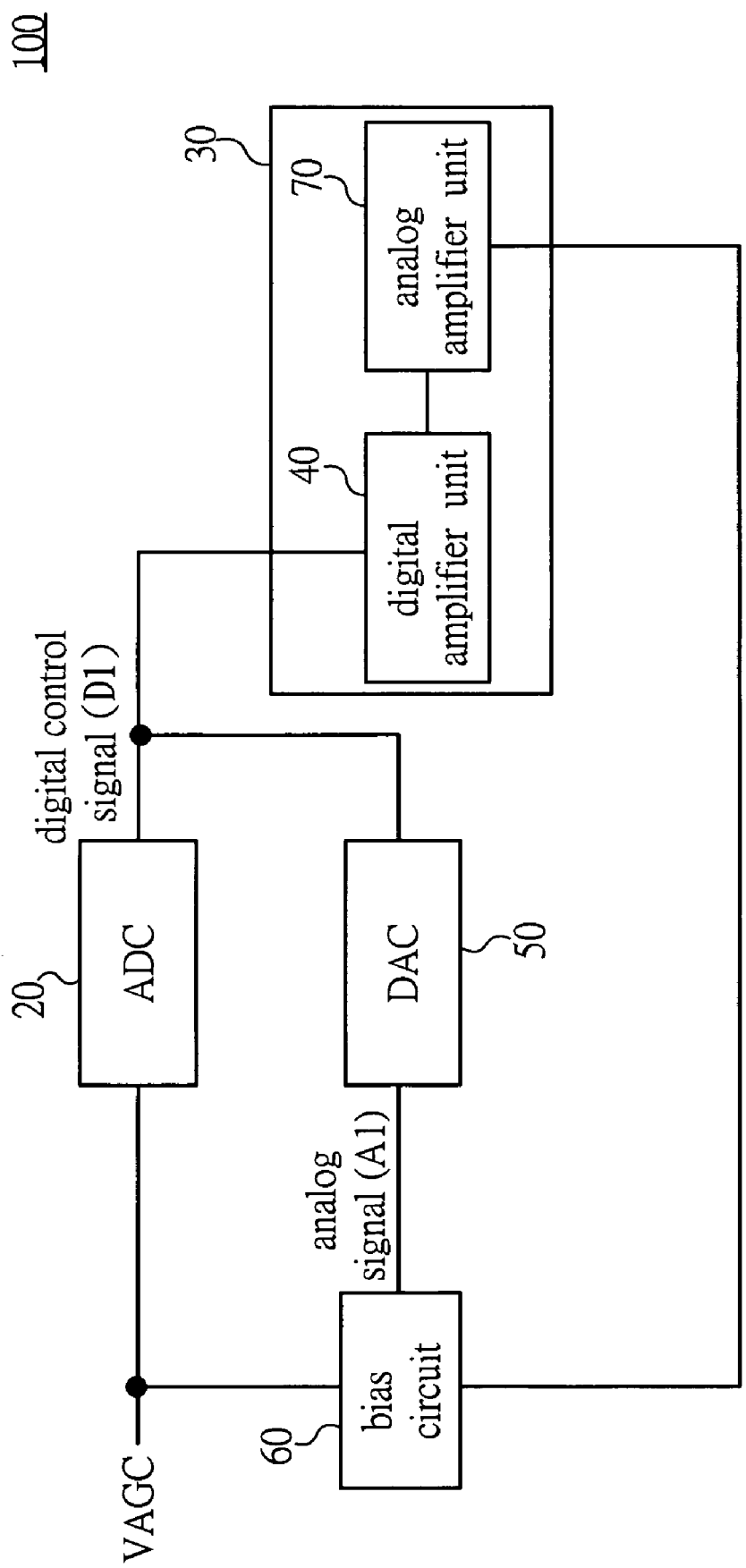
FIG. 2 shows a block diagram of an amplifier gain control circuit for the wireless transceiver according to a preferred embodiment of the present invention.

Referring to FIG. 2, a block diagram of an amplifier gain control circuit for the wireless transceiver according to a preferred embodiment of the present invention is disclosed. The amplifier gain control circuit 100 comprises at least one amplifier 30, an analog to digital converter (ADC) 20, a digital to analog converter (DAC) 50 and a bias circuit 60.

The ADC 20 is connected to the amplifier 30 and used for receiving an analog gain control voltage VAGC to transform into a digital control signal D1 that can be used for controlling the gain of the amplifier 30. The DAC 50 is connected to the ADC 20 and used for receiving the digital control signal D1 generated from the ADC 20 to transform into an analog signal A1. The bias circuit 60 is connected to the DAC 50 and the amplifier 30, used for receiving the analog signal A1 generated from the DAC 50 and the analog gain control voltage VAGC to fine tune the gain of the amplifier 30 according to the difference between the analog signal A1 and the analog gain control voltage VAGC.

The amplifier 30 comprises a digital amplifier unit 40 and an analog amplifier unit 70, wherein the digital amplifier unit 40 is connected to the ADC 20 and used for receiving the digital control signal D1 that is used for controlling the gain of the digital amplifier unit 40, the analog amplifier unit 70 is connected to the digital amplifier unit 40 and the bias circuit 60, and the bias circuit 60 can be provided the analog bias that will be fine tuning and correcting the gain of the analog amplifier unit 70.

In accordance with the embodiment, the digital control signal D1 is used for controlling the gain of the digital amplifier unit 40, therefore, the amplifier 30 during the substantial gain adjustment will prevent to operate in the nonlinear area.

Finally, the bias circuit 60 is used for fine tuning the gain of the analog amplifier unit 70 by the analog process to correct the least bit error during the digital process; thus, a correct amplifier 30 gain is adjusted.

Figure 3:
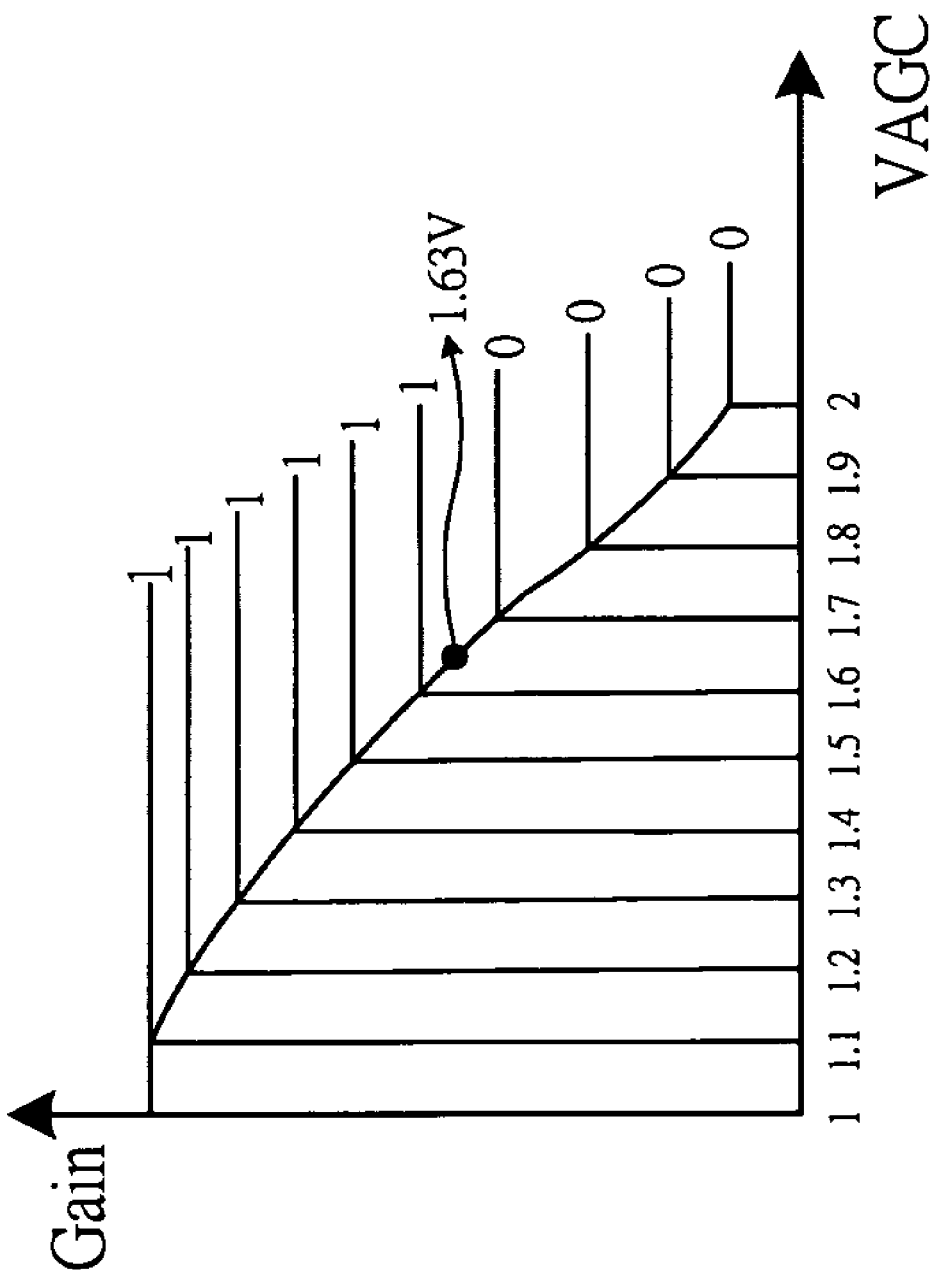
FIG. 3 is a curve diagram showing the characteristics of the analog to digital converter (ADC)

Regarding to the embodiment, the ADC 20 is with ten-level resolution, and the voltage range of the analog gain control voltage VAGC is set around 1V to 2V, therefore, each unit segment is set as 0.1V, as shown on FIG. 3. Certainly, the previous values are changeable in practice.

The ADC 20 consists of a plurality of comparators, and each unit segment is corresponding to a comparator. While the analog gain control voltage VAGC is inputted into the ADC 20, each comparator of the ADC 20 will compare with the analog gain control voltage VAGC for having the digital control signal D1. For example, if the analog gain control voltage VAGC is 1.63V, then the comparator will output a result as the value "1" according to each unit segment that is located smaller than 1.6V, otherwise, the comparator will output a result as the value "0" according to each unit segment that is located larger than 1.7V, thus, the ADC 20 will generate the digital control signal D1 that is with ten-level representing as the binary code "1111110000". And furthermore, the digital control signal D1 can be used for controlling the gain of the digital amplifier unit 40. Regarding to another embodiment, the digital control signal D1 can be decoded by a decoder to further control the gain of the digital amplifier unit 40.

Figure 4:
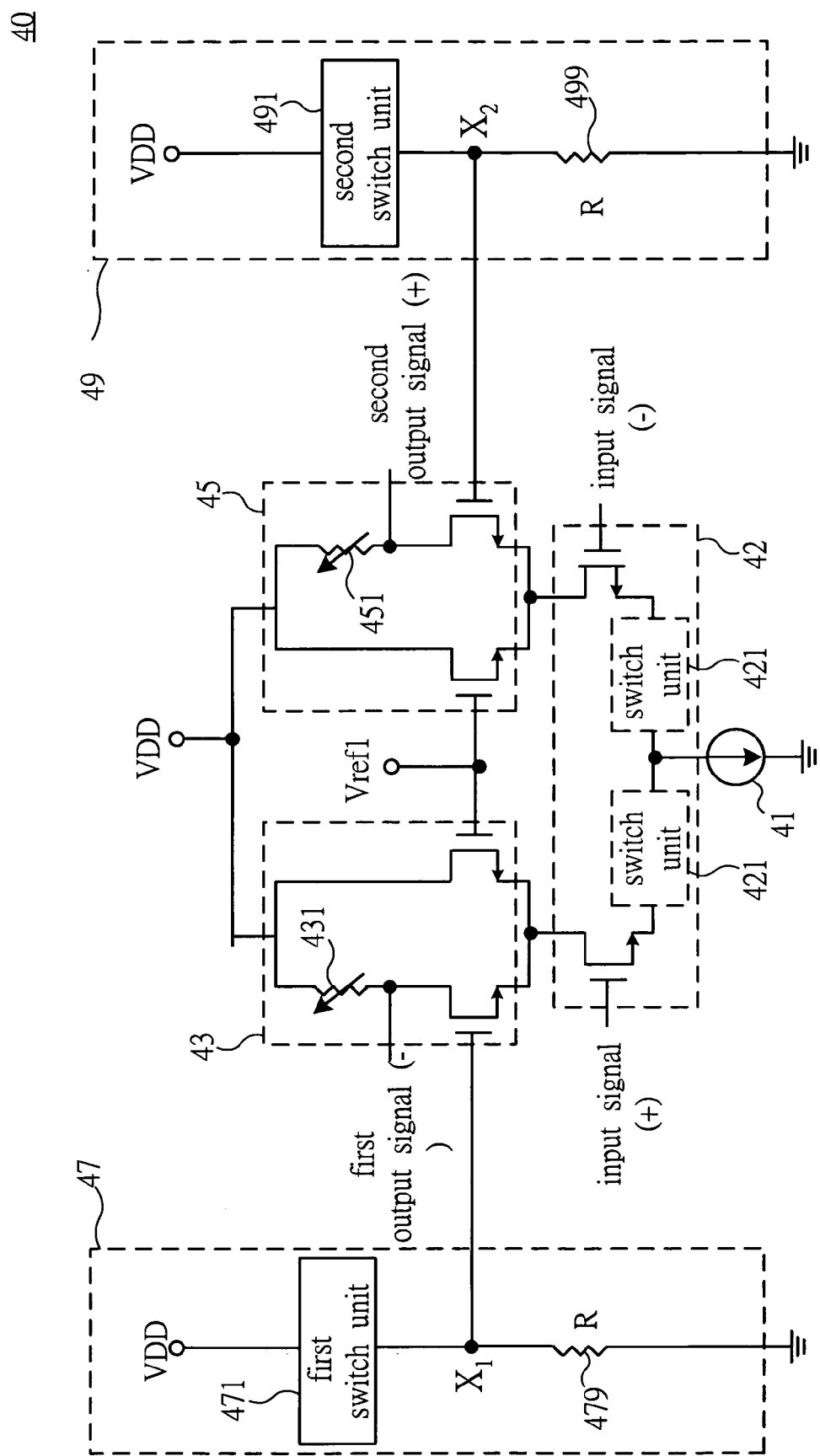
FIG. 4 is a circuit diagram of the digital amplifier unit according to an embodiment of the present invention.
Figure 5:
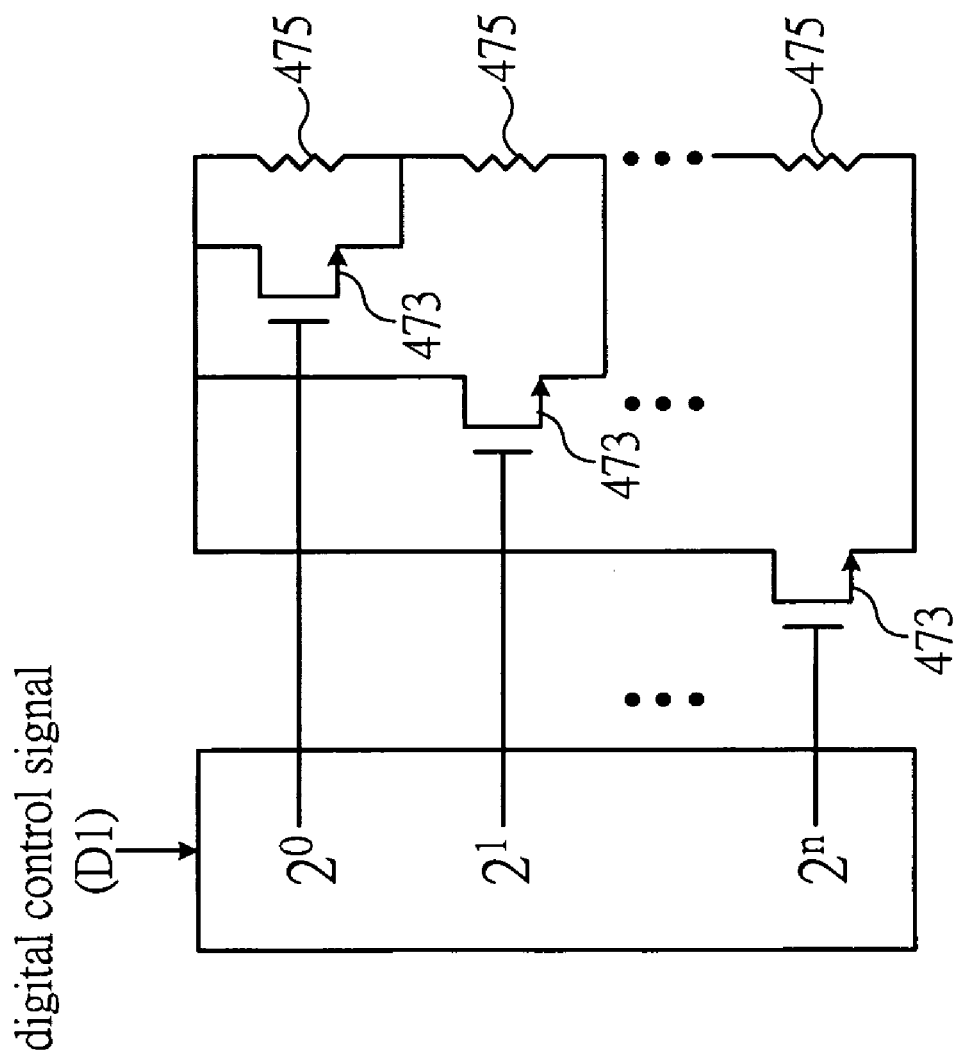
FIG. 5 is a circuit diagram of the first switch unit according to an embodiment of the present invention.

Referring to FIG. 4 and FIG. 5, a circuit diagram of the digital amplifier unit and the first switch according to an embodiment of the present invention is disclosed. The digital amplifier unit 40 comprises a current source 41, a first differential unit 42, a second differential unit 43, a third differential unit 45, a first control unit 47, and a second control unit 49.

Wherein the first differential unit 42 is connected to the current source 41, the second differential unit 43, and the third differential unit 45 respectively, used for receiving an input signal that is with positive and negative phases (+/−), which is as a differential input signal (+/−).

The second differential unit 43 comprises a first loading element 431, and the second differential unit 43 is connected to the first control unit 47 and a first voltage reference Vref1 respectively, further outputting a first output signal that is with negative phase (−).

The third differential unit 45 comprises a second loading element 541, and the third differential unit 45 is connected to the second control unit 49 and the node of the first voltage reference Vref1 respectively, further outputting a second output signal that is with positive phase (+), wherein the first output signal (−) and the second output signal (+) can be constituted a differential output signal (+/−).

The first control unit 47 is used for providing a first control voltage X1, and the second differential unit 43 will receive the first control voltage X1. The second control unit 49 is used for providing a second control voltage X2, and the third differential unit 45 will receive the second control voltage X2. Furthermore, the values of the first control voltage X1 and the second control voltage X2 are determined by the digital control signal D1, and the first control voltage X1 and the second control voltage X2 are inputted into the second differential unit 43 and the third differential unit 45 at the same time for simultaneously controlling the second differential unit 43 and the third differential unit 45 to generate the differential output signal (+/−), thus, the gain of the amplifier 30 can be controlled by the digital process.

The first control unit 47 comprises a first switch unit 471 and a first resistor 479 that are connected together, wherein the first switch unit 471 is used for receiving the digital control signal D1 that will be altering the first control voltage X1 loaded on the first resistor 479. The second control unit 49 comprises a second switch unit 491 and a second resistor 499 that are connected together, wherein the second switch unit 491 can be used for receiving the digital control signal D1 as well that will be altering the second control voltage X2 loaded on the second resistor 499.

As show on FIG. 5, the circuit diagram of the first switch unit 471 comprises a plurality of transistors 473 and resistors 475, wherein each of the resistors 475 is connected together in series and further connected to the corresponding transistor 473 in parallel. And, the transistors 473 can be used for receiving the digital control signal D1, such as $2^n \ldots 2^1 2^0$.

While the first switch unit 471 receives the digital control signal D1, each bit signal of the digital control signal D1 will determine whether enabling each transistor 473 or not. For example, if the bit $2^0$ is as value "1" in respect of the digital control signal D1, then the transistor 473 that receives the bit $2^0$ would be enabled, otherwise, if the bit $2^0$ is as value "0" in respect of the digital control signal D1, then the transistor 473 that receives the bit $2^0$ would be disabled, in other words, the transistors 473 will be enabled/disabled according to the digital control signal D1, furthermore, the first control voltage X1 can be regulated since the current flowing through the first resistor 479 is altered according to the alteration of the resistance of the first switch unit 471. Therefore, the digital control signal D1 can be used for regulating the value of the first control voltage X1 and further controlling the gain of the digital amplifier unit 40 accordingly.

The structures of the second switch unit 491 and the first switch unit 471 are similar, therefore, the same number of transistors 473 and resistors 475 can be applied for both, otherwise, different number of which is also an option in practice.

The first loading element 431 and/or the second loading element 451 can be used for regulating the loading voltage as well, being similarly with a variable resistor. So the variation of the loading voltages on the first loading element 431 and the second loading element 451 will alter the first output signal (−) and the second output signal (+) at the same time, and furthermore adjusting the gain of the digital amplifier unit 40.

In accordance with another embodiment, the first differential unit 42 of the digital amplifier unit 40 further comprises at least one switch unit 421, the structure of which is similar with the first switch unit 471, as shown on FIG. 5, thus, the transistor 473 can be used for altering the loading voltage on the first differential unit 42 according to the enabling and disabling of the transistor 473. Furthermore, the number of the transistors 473 and resistors 475 of the switch unit 421 can be the same with the first switch unit 471, and the gain of the digital amplifier unit 40 can be adjusted according to the digital control signal D1 that is used for controlling the loading voltage on first switch unit 421. As well as, regarding to another embodiment, the number of the transistors 473 and resistors 475 of the switch unit 421 can be different with the first switch unit 471, and the gain of the digital amplifier unit 40 is adjustable also.

Figure 6:
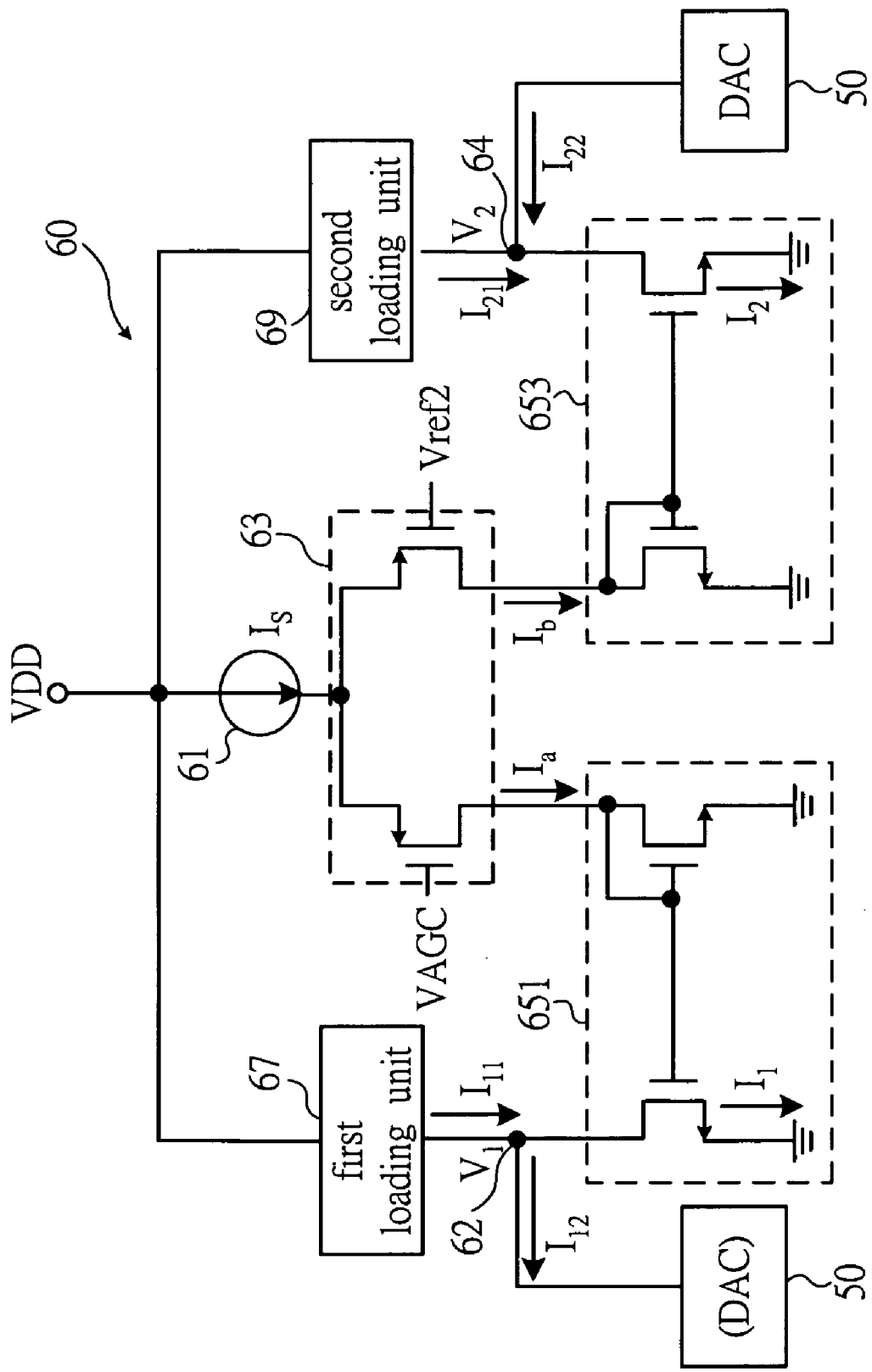
FIG. 6 is a bias circuit diagram according to an embodiment of the present invention.

Referring to FIG. 6, a bias circuit diagram according to an embodiment of the present invention is disclosed. The bias circuit 60 comprises a current source 61, a differential unit 63, a first current mirror 651, and a second current mirror 653, wherein the current source 61 is connected to the differential unit 63, and the differential unit 63 is connected to the first current mirror 651 and the second current mirror 653 respectively.

The differential unit 63 receives a current Is provided from the current source 61, a second voltage reference Vref2 and the analog gain control voltage VAGC respectively, wherein the output current Ia and Ib of the differential unit 63 will be changed according to the alteration of the analog gain control voltage VAGC. The first current mirror 651 receives and mirrors the current Ia to generate a first current I1. The second current mirror 653 receives and mirrors the current Ib to generate a second current I2. The first current mirror 651 is connected to a first loading unit 67 and the DAC 50 through a first node 62. The second current mirror 653 is connected to the second loading unit 69 and the DAC 50 through a second node 64. Furthermore, the first loading unit 67 and the second loading unit 69 will generate a first loading current I11 and a second loading current I21 respectively.

The values of the first current I1 and the second current I2 can be changed according to the controlling of the analog gain control voltage VAGC, therefore, the first voltage V1 and the second voltage V2 respectively had on the first node 62 and the second node 64 will be pulled up or down accordingly.

While the analog gain control voltage VAGC is larger than the voltage reference Vref2, the first voltage V1 will be larger than the second voltage V2, thereafter, the ADC will sense the VAGC voltage go high and generate bits to control the DAC. The current I12 will flow into the DAC 50 form the first node 62, and further the first loading current I11 will be altered to result that the first voltage V1 on the first node 62 will be pulled down, and the second node 64 will receives a current I22 from the DAC 50 at the same time, the second loading current I21 will be altered to result that the second voltage V2 on the second node 64 will be pulled up, thus, the first voltage V1 will be equal to the second voltage V2 according to the pulling down of the first voltage V1 and the pulling up of the second voltage V2.

Oppositely, once the analog gain control voltage VAGC is smaller than the voltage reference Vref2, then the first node 62 will receive a current I12 from the DAC 50, and a current I22 will flow into the DAC 50 from the second node 64. Besides, the values of the current I12 and the current I22 are the same and with opposability.

Regarding to the first node 62, the first current I1 generated from the first current mirror 651 will be equal to the sum of the current −I12 and the first loading current I11. Regarding to the second node 64, the second current I2 generated from the second current mirror 653 will be equal to the sum of the current I22 and the second loading current I21. That is, the first loading current I11 will be the sum of current between the first current I1 and the current I12, and the second loading current I21 will be the differential current between the second current I2 and the current I22.

Therefore, if the value of the analog gain control voltage is selectively as 1.1V, 1.2V, 1.3V, . . . , 1.9V, or 2.0V, and the subtraction of the analog gain control voltage VAGC and the analog voltage A1 transformed from the DAC 50 results to be the value "0", then the gain of the amplifier 30 would not be necessary to correct in respect of the analog process. For example, if the analog gain control voltage VAGC is equal to 1.6V, then the ADC 20 would output the binary code "1111110000", and the analog voltage A1 transformed from the DAC 50 would be equal to 1.6V thereafter, thus, the gain of the amplifier 30 would not be corrected by analog process since both of voltages are the same.

On the contrary, if the subtraction of the analog gain control voltage VAGC and the analog voltage A1 transformed from the DAC 50 results to be a voltage difference, then the gain of the amplifier 30 would be corrected by the analog process. For example, if the analog gain control voltage VAGC is equal to 1.61V to 1.69V, then the ADC 20 would output the binary code "1111110000", but the analog voltage A1 transformed from the DAC 50 would be equal to 1.6V thereafter, therefore, there would be a voltage difference between the analog gain control voltage VAGC (such as 1.63V) and the analog voltage A1 transformed from the DAC 50 (such as 1.6V), thus, the gain of the amplifier 30 would be necessary corrected by analog process since the voltage difference (such as 0.03V) exists.

Besides, since the voltage difference will result the first voltage V1 on the first node 62 and the second voltage V2 on the second node 64 to be equal, then the values of the current Ia and current Ib on the bias circuit 60 can be adjusted by the analog gain control voltage VAGC for altering the voltages V1 and V2 to further control the gain of the amplifier 30. Therefore, as shown on FIG. 3, the subtraction of the analog gain control voltage VAGC and the analog voltage A1 transformed from the DAC 50 would have a differential voltage range (0.1V) between 1.6V to 1.7V, the differential voltage range would be used for controlling the analog amplifier range of the gain of the amplifier 30.

Regarding the embodiment, the bias circuit 60 and the DAC 50 are connected together, and the first voltage V1 and the second voltage V2 are pulled up or pulled down according to the currents I11 and I12 that can be flowed into, or flowed out, the DAC 50, wherein the difference voltage between the first voltage V1 and the second voltage V2 is equal to the difference voltage between the analog gain control voltage VAGC and the analog signal A1, wherein the difference voltage is occurred according to error of the least significant bit (LSB) during the digital transforming of the ADC 20.

Additionally, for convenience, the bias circuit 60, as shown on FIG. 6, is connected to two different DAC 50 respectively. However, these two DAC 50 are the same one in practice, and the current I12 or I22 is hereby flowed into, or flowed out, the bias circuit 60.

Therefore, while the analog signal A1, such as the current I12 or I22, is provided on the first node 62 and the second node 64, the analog signal A1 will subtract with the first current I1 and the second current I2 for altering the loading current I11 and I21.

Regarding to another embodiment, the analog signal A1 provided from the DAC 50 can be selectively as an analog voltage, which can be connected to the first node 62 and the second node 64 through an adding circuit or a subtracting circuit, such as an operation amplifier, for fine tuning the first voltage V1 and second voltage V2 by the voltage controlling.

Referring to FIG. 7, a circuit diagram of the digital amplifier unit according to an embodiment of the present invention is disclosed. The analog amplifier unit 70 comprises a current source 71, a first differential unit 73, a second differential unit 75, and a third differential unit 77, wherein the first differential unit 73 is connected to the current source 71, the second differential unit 75, and the third differential unit 77, used for receiving an input signal that is with positive and negative phases (+/−), which is as the output signal (+/−) generated from the digital amplifier unit 40, furthermore, the analog amplifier unit 70 is connected to the first node 62 and the second node 64 of the bias circuit 60 respectively, as shown on FIG. 6.

The second differential unit 75 comprises a first loading element 751, and the second differential unit 75 is connected to the first node 62 and the second node 64 respectively for receiving the first voltage V1 and the second voltage V2 to generate a corresponding first output signal (−) accordingly.

The third differential unit 77 comprises a second loading element 771, and the second differential unit 77 is connected to the first node 62 and the second node 64 respectively for receiving the first voltage V1 and the second voltage V2 to generate a corresponding second output signal (+) accordingly. Therefore, the first output signal (−) and the second output signal (+) can be constituted a differential output signal (+/−). The analog amplifier unit 70 can be used for correcting the error of the LSB during the digital process, such that the gain of the amplifier 30 will be correct surely.

Besides, the first loading element 751 and the second loading element 771 can be used for regulating the loading voltage, being similarly with a variable resistor. So the variation of the loading voltages on the first loading element 751 and the second loading element 771 will alter the first output signal (−) and the second output signal (+) at the same time, and furthermore adjusting the gain of the analog amplifier unit 70.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An amplifier gain control circuit for the wireless transceiver, comprising:
   at least one amplifier;
   an analog to digital converter connected to said amplifier and used for receiving an analog gain control voltage to transform into a digital control signal, wherein the digital control signal is used for controlling the gain of said amplifier by a digital process;
   a digital to analog converter connected to said analog to digital converter and used for receiving said digital control signal to transform into an analog signal; and
   a bias circuit connected to said digital to analog converter and said amplifier, used for receiving said analog gain control voltage and said analog signal and accordingly providing an analog bias to said amplifier to fine tune and correct the gain of said amplifier by an analog process, such that the least bit error occurred during the gain of said amplifier by the digital process can be corrected.

2. The amplifier gain control circuit of claim 1, wherein said amplifier comprises:
   a digital amplifier unit connected to said analog to digital converter and used for receiving said digital control signal; and
   an analog amplifier unit connected to said bias circuit and said digital amplifier unit.

3. The amplifier gain control circuit of claim 2, wherein said digital amplifier unit comprises:
   a current source;
   a first differential unit connected to said current source and used for receiving an input signal;
   a second differential unit comprising a first loading element, connected to said first differential unit, used for receiving a first control voltage and a first reference voltage to generating a first output signal; and
   a third differential unit comprising a second loading element, connected to said first differential unit, used for receiving a second control voltage and said first reference voltage to generate a second output signal.

4. The amplifier gain control circuit of claim 3, wherein said digital amplifier unit further comprises:
   a first control unit connected to said second differential unit for providing said first control voltage; and
   a second control unit connected to said third differential unit for providing said second control voltage.

5. The amplifier gain control circuit of claim 4, wherein said first control unit comprises a first switch unit and a first resistor, and said second control unit comprises a second switch unit and a second resistor.

6. The amplifier gain control circuit of claim 5, wherein said first switch unit comprises a plurality of transistors and resistors, wherein said resistors are connected together in series and further connected to the corresponding transistors in parallel.

7. The amplifier gain control circuit of claim 6, wherein said transistor is used for receiving said digital control signal.

8. The amplifier gain control circuit of claim 5, wherein said second switch unit comprises a plurality of transistors and resistors, wherein each resistor is connected together in series and further connected to the corresponding transistor in parallel.

9. The amplifier gain control circuit of claim 8, wherein said transistor is used for receiving said digital control signal.

10. The amplifier gain control circuit of claim 3, wherein said first differential unit comprises at least one switch unit.

11. The amplifier gain control circuit of claim 10, wherein said switch unit comprises a plurality of transistors and resistors, wherein each resistor is connected together in series and further connected to the corresponding transistor in parallel.

12. The amplifier gain control circuit of claim 11, wherein said transistor is used for receiving said digital control signal.

13. The amplifier gain control circuit of claim 2, wherein said bias circuit comprises:
   a differential unit connected to a current source, used for receiving said analog gain control voltage and a second voltage reference;
   a first current mirror connected to said differential unit, wherein a first node of said first current mirror is connected to a first loading unit and said digital to analog converter; and
   a second current mirror connected to said differential unit, wherein a second node of said second current mirror is connected to a second loading unit and said digital to analog converter.

14. The amplifier gain control circuit of claim 13, wherein said digital to analog converter comprises at least one current mirror unit.

15. The amplifier gain control circuit of claim 13, wherein said analog amplifier unit is respectively connected to the first node and the second node of said bias circuit.

16. The amplifier gain control circuit of claim 15, wherein said analog amplifier unit comprises:
   a current source;
   a first differential unit connected to said current source and used for receiving an input signal;
   a second differential unit comprising a first loading element, connected to said first differential unit, the first node and the second node of said bias circuit; and
   a third differential comprising a second loading element, connected said first differential unit, the first node and the second node of said bias circuit.

* * * * *